(12) United States Patent
Glenske et al.

(10) Patent No.: US 11,493,537 B2
(45) Date of Patent: Nov. 8, 2022

(54) MAGNETIC FIELD-BASED CURRENT SENSOR FOR FREQUENCY-COMPENSATED MEASUREMENT OF ALTERNATING CURRENTS

(71) Applicant: Sensitec GmbH, Wetzlar (DE)

(72) Inventors: Claudia Glenske, Leun (DE); Matthias Brusius, Hartenrod (DE)

(73) Assignee: SENSITEC GMBH, Wetzlar (DE)

( * ) Notice: Subject to any disclaimer, the term of this patent is extended or adjusted under 35 U.S.C. 154(b) by 0 days.

(21) Appl. No.: 17/632,488

(22) PCT Filed: Aug. 7, 2020

(86) PCT No.: PCT/EP2020/072293
§ 371 (c)(1),
(2) Date: Feb. 2, 2022

(87) PCT Pub. No.: WO2021/023874
PCT Pub. Date: Feb. 11, 2021

(65) Prior Publication Data
US 2022/0268812 A1 Aug. 25, 2022

(30) Foreign Application Priority Data

Aug. 8, 2019 (DE) .......................... 102019121458.0
Sep. 11, 2019 (DE) .......................... 102019124391.2

(51) Int. Cl.
*G01R 15/14* (2006.01)
*G01R 19/00* (2006.01)
(52) U.S. Cl.
CPC ......... *G01R 15/14* (2013.01); *G01R 19/0092* (2013.01)

(58) Field of Classification Search
CPC ........................... G01R 15/14; G01R 19/0092
See application file for complete search history.

(56) References Cited

U.S. PATENT DOCUMENTS

2015/0323568 A1* 11/2015 Schmitt ............. G01R 19/0092
324/126
2017/0067941 A1 3/2017 Hegedus

FOREIGN PATENT DOCUMENTS

| DE | 4300605 A1 | 7/1994 |
| DE | 10110254 A1 | 9/2002 |
| DE | 102015210426 A1 | 12/2016 |
| DE | 102017114377 A1 | 12/2017 |

(Continued)

OTHER PUBLICATIONS

International Search Report dated Nov. 11, 2020; International Application PCT/EP2020/072293.

*Primary Examiner* — Dominic E Hawkins
(74) *Attorney, Agent, or Firm* — Dinsmore & Shohl LLP

(57) ABSTRACT

A current sensor for magnetic field-based current determination of an alternating current through a current conductor is based on a magnetic field-sensitive sensor element. The sensor element is arranged spatially adjacent the current conductor to detect a magnetic field brought about by the alternating current I in the current conductor. It is proposed that at least one conductive compensation element be arranged separately from the current flow through the current conductor and spatially adjacent the sensor element and the current conductor to compensate frequency-dependent distortions of the magnetic field by means of an induction-generatable compensation magnetic field.

10 Claims, 10 Drawing Sheets

(56) References Cited

FOREIGN PATENT DOCUMENTS

| | | | |
|---|---|---|---|
| EP | 0565946 | A2 | 10/1993 |
| EP | 2775311 | A2 | 9/2014 |
| WO | 2014001473 | A1 | 1/2014 |
| WO | 2019072421 | A1 | 4/2019 |

* cited by examiner

MAGNETIC FIELD-BASED CURRENT SENSOR FOR FREQUENCY-COMPENSATED MEASUREMENT OF ALTERNATING CURRENTS

CROSS-REFERENCE TO RELATED APPLICATIONS

This application is the U.S. National Stage of PCT/EP2020/072293 filed Aug. 7, 2020, which claims priority to German Patent Application No. 102019121458.0 filed Aug. 8, 2019, and German Patent Application No. 102019124391.2 filed Sep. 11, 2019 the content of both of which are incorporated herein by reference in their entirety.

FIELD OF THE INVENTION

The present invention relates to an AC sensor with a frequency-compensated measurement characteristic for exact magnetic field-based measurement of current intensities through a current conductor over a large frequency range. In addition, the invention relates to use of such an AC sensor.

BACKGROUND OF THE INVENTION

Magnetic field-based current sensors serve in the electrically isolated, contactless measurement of currents.

For the purposes of the invention, magnetic field-based current sensors are considered which serve to measure the intensity of a current with at least components affected by alternating current through one or more conductors on the basis of the magnetic field surrounding the conductor. The current may be a pure, generally sinusoidal, alternating current (AC current), an alternating current affected by a direct current (DC current), a current affected by harmonics with one or more frequency components or indeed a direct current with high switching frequency—in any event, a current which brings about an alternating magnetic field which is capable of inducing eddy currents in metallic conductors.

Current sensors of the type in question are used for example in relation to powertrain and charging for e-mobility and in automotive applications for electrically driven private and commercial vehicles, large-scale industrial drives and in renewable energy technology such as photovoltaics or wind power. At present, these sectors make use of conventional current sensors in closed-/open-loop Hall or fluxgate technology and isolating transformers with decoupled measuring shunts. Such current sensors are inexpensive and have a low frequency bandwidth. However, they also require a relatively large installation space and have elevated EMC sensitivity (electromagnetic compatibility) or require additional refrigeration.

Contactless current sensors for measuring the intensity of a current through one or more current conductors on the basis of the magnetic field H along a closed curve S and surrounding the current conductor are sufficiently well known in the art. They are based on a conclusion being drawn as to the total current I passing through the area A bounded by the curve S, according to Ampere's Law:

$$I = \iint_A \vec{J} \cdot d\vec{A} = \oint_S \vec{H} \cdot d\vec{s}$$

This allows contactless current detection without intervention in the operation of an electrical circuit, in particular without interruption or interposition of an electrical circuit.

Arrangements are known from the prior art which use magnetic field-sensitive gradient sensors to measure a magnetic field strength difference in a measurement plane between conduction currents of adjacent current conductors. Magnetoresistive sensor elements are generally used as magnetic field-sensitive sensor elements which operate for example according to the planar Hall effect, the AMR effect, the GMR effect or the TMR effect, or which are configured as a magnetoresistor (MDR—Magnetic Dependent Resistor). However, these also include sensors which provide a magnetic field-dependent voltage, such as for example Hall sensors, or otherwise provide a sensor signal as a function of the intensity of the magnetic field. By way of example and not exhaustively, reference is further made to SQUID based sensors (Superconducting Quantum Interference Device) or to a fluxgate magnetometer.

In the field of magnetoresistive sensor elements, the AMR effect is based on a magnetic field-based change in resistance in a ferromagnetic layer which has internal polarisation, wherein an external magnetic field brings about a change in the angle of the resultant magnetic vector of the ferromagnetic layer relative to the current direction. TMR and GMR sensors are based on the TMR or GMR effect and consist of a plurality of layers just a few nanometres thick, wherein at least one reference layer has a fixedly oriented magnetisation and the magnetisation of a free layer follows an external magnetic field. The angle of the magnetisations between reference layer and free layer influences the resistance value, which changes with the change in angle of the external magnetic field.

If two sensor elements are placed spacedly next to one another, the sensor may be made robust towards external interference fields by differential evaluation of the sensor signals. The difference quotient is understood to be a gradient of the magnetic field. These gradient sensors are particularly suitable for application in current sensors. Such magnetic field-sensitive sensor elements may thus take the form of gradient sensors, based on two magnetic field sensors, wherein the respective magnetic field sensors detect the magnetic field caused by each current part and the magnetic field sensors internally or externally determine a gradient value therefrom.

In a magnetic field-sensitive current sensor the sensor element is arranged in the region of the conductor portion active in terms of current measurement such that the magnetic field of the conductor portion active in terms of current measurement brings about a major change in sensor value, in particular a major change in resistance, and the magnetic field of the conductor portion parasitic in terms of current measurement brings about minor or substantially no changes in sensor value, due to the spatial orientation of the sensor element relative to the conductor portion parasitic in terms of current measurement and/or as a result of field compensation effects of further current-carrying elements.

Previous solutions for current measurement in a gradiometer arrangement are generally based on U-shaped current conductors for generating a primary current-dependent field gradient, as described for example in DE 43 00 605 A1. To this end, a current flowing in both legs of the U-shaped current conductor is considered, wherein the current flowing into one leg and out in the neighbouring leg forms a superposed overall magnetic field between the legs, the field gradient of which is detected in a measurement plane. Naturally, the same amount of current flows in both legs, but in opposing directions. With increasing miniaturisation, interference field components occur in such a current sensor, for example as a result of currents in the connecting piece between the legs of the U-shaped conductor, and assume a magnitude which leads to a change in the magnetisation of the magnetic field-sensitive layers of the xMR sensor.

WO 2014/001473 A1 represents a further development in relation to this previously known U-shaped geometry, wherein the U-shaped current conductor comprises at least one conductor portion active in terms of current measurement and at least one conductor portion parasitic in terms of current measurement. The sensor element has at least one sensitivity direction in which magnetic field components bring about a major change in sensor value. To this end, the sensor element is oriented in such a way in the region of the conductor portion active in terms of current measurement, in particular is rotated, tilted and/or height-offset relative to the conductor portion parasitic in terms of current measurement, such that the magnetic field of a conductor portion active in terms of current measurement of the U-shaped conductor element is oriented substantially in the sensitivity direction and the magnetic field of a conductor portion parasitic in terms of current measurement of the U-shaped conductor element is oriented substantially not in the sensitivity direction, in particular at right angles to the sensitivity direction. To support the sensitivity of the sensor element, the parallel legs may be flanked by permanent magnets, which provide an auxiliary magnetic field for supporting internal magnetisation of the sensor element.

The inductance formed by the U-shaped current legs leads to voltage peaks, something which has to be compensated by a switched-in power semiconductor electronics unit, which is designed for example for converter operation. This must thus be designed for relatively high voltage peaks.

Most recently, a further development of a current sensor has been described in WO 2019/072421 A1 which, instead of a U-shaped current leg, comprises two parallel conductor portions height-offset relative to a measurement plane of a gradient sensor element and through each of which one part of the current to be measured flows in the same direction. Through the current distribution, the current load of the conductor portions can be reduced and parasitic interference fields of a transverse leg or of the connecting line prevented.

In the field of alternating current measurement, the skin effect arises due to self-induction of the current-generated alternating magnetic field in the current conductor. Due to a high-frequency alternating current in the current conductor, a current density is established in the inner regions which is lower than in the outer regions by a current displacement effect. This means that, in the case of an alternating current, eddy currents and electromagnetic fields are generated as a function of frequency which displace the charge carriers to the surface of the conductor. In this way, however, when the frequency increases the magnetic field surrounding the current conductor changes, such that, for the same amount of current, the sensor element sees a different magnetic field than in the case of direct current. To increase the measuring accuracy of a current sensor, it is for example known from DE 101 10 254 A1 to shape the cross-section of the current conductor in such a way that no eddy currents can occur in the current conductor itself.

In addition, a proximity effect acts between two closely adjacent conductors. The proximity effect is a current displacement phenomenon, wherein this frequency-dependent phenomenon is limited to eddy currents between closely adjacent conductors in which alternating currents flow in the same or opposing directions, as is the case with height-offset conductor portions or U-shaped conductor portions. Depending on current intensity, the proximity effect may act over a spacing of the conductors of a few millimetres up to several centimetres. According to the proximity effect, which is particularly pronounced at higher frequencies, opposingly directed high-frequency currents, as in a U-shaped current conductor, tend to flow as closely as possible to one another, and identically oriented high-frequency currents, as in height-offset parallel current conductors, tend to displace one another. The current flow is concentrated onto the region in which the two conductors lie closely next to one another or are a long way apart.

The cause of the skin and proximity effects are repelling Lorentz forces of the opposing currents or identically oriented partial currents in the two conductor portions, reinforced by eddy currents inside the conductor portions. In contrast to the U-shaped current conductor, where the proximity effect brings about current concentration close to the sensor and concomitant rises in amplitude in the frequency response of the sensor arrangement may be compensated with RC elements, in height-offset conductor portions an increase in amplitude for higher frequency components is barely possible without losing DC measuring capability or considerable measurement signal effort. Suppression of these HF current density effects by using for example intrinsically insulated HF stranded wires fails on grounds of economic viability and the possibility of generating sufficiently large fields at the sensor location in the light of the low current-carrying capacity per line diameter of the HF stranded wire compared with solid material.

In the case of the U-shaped current conductors, superimposition of the two above-stated effects brings about a high current density in the inner regions of the legs, in particular in the edges. In the case of height-offset current conductors flowed through in parallel, a high current density arises in the outer regions, in particular in the edges, due to the above-mentioned distortion effects. High-frequency currents are thus carried markedly more densely or less densely and the field gradient increases or reduces in the region of the sensor relative to a pure direct current measurement. In this regard, the previously known current sensors are dependent with regard to their measuring quality on current frequency, wherein different signal values of the current sensor are generated at identical current intensities and different frequencies.

Thus, starting from the above-stated prior art, the problem arises that measurement errors occur as a function of the current frequency or of the transient current behaviour.

With a pure DC or pure AC measurement with a restricted frequency range, the geometry may be designed for precisely this case, but the error increases significantly if limits are exceeded. For a current sensor with U-shaped current conductor, a relatively complex geometry may be achieved for selected applications and the skin and proximity effect can be compensated in a narrow, previously known frequency range.

In addition, subsequent correction in certain frequency ranges may be provided by complex signal processing by ascertaining the frequency components.

On the basis of the above-stated prior art, the object of the invention is to reduce the disadvantages of known arrangements. In particular, it is intended for high current intensities of several hundred amperes to be measurable over a large frequency range with a simple, inexpensive structure. Small spatial dimensions and good measuring accuracies at DC working frequencies of up to 50 to 150 kHz are desirable.

SUMMARY OF THE INVENTION

The object is achieved by a current sensor for magnetic field-based current determination of an alternating current I through a current conductor on the basis of a magnetic field-sensitive sensor element, wherein the sensor element is arranged spatially adjacent the current conductor for detecting a magnetic field brought about in the current conductor by the alternating current I.

For the current sensor according to the invention, it is proposed that at least one conductive compensation element be arranged separately from the flow of alternating current I through the current conductor and spatially adjacent the sensor element and the current conductor to compensate frequency-dependent distortions of the magnetic field by means of an induction-generatable compensation magnetic field.

In the case of an alternating current (AC current), in the compensation elements formed in as a rule as metal blocks, eddy currents are generated by induction of the alternating magnetic field, which eddy currents, with an appropriate arrangement of the compensation elements, can compensate or significantly suppress the undesired current distribution by skin and proximity effect in the current conductor. In the optimal case, the magnetic field which arises is completely independent of current frequency.

The invention considerably extends the usable frequency range, such that the useful range is no longer restricted. The geometry of the current conductor may, as previously, be relatively simple. The complexity of a filter circuit of the downstream electronics may be simplified or optionally dispensed with completely. Finally, a distinct cost reduction may be achieved in the production and integration of the current sensor into an electrical system.

The current sensor according to the invention is based on the principle of keeping the magnetic field gradients constant for current measurement in the frequency range to be measured. By means of the compensation elements, opposing eddy currents are induced at high frequencies, which effect may be designated "eddy current traps". Compensation may be used irrespective of the current sensor technology used, and thus for xMR, Hall or any other sensor element technologies for measuring magnetic field gradients, as only the frequency dependency of the magnetic field at the sensor location is manipulated.

A significant advantage of the arrangement with compensation elements consists in using simple means to compensate interfering influences of frequency-dependent current density effects directly at the magnetic field gradient as an input variable of the measuring system. In contrast to previously known current sensors, this enables compensation right at the measuring output of the sensor element, such that subsequent processing of the measuring signal for example with RC elements, which generally reduces the frequency range, can be dispensed with or simplified. This bandwidth advantage opens up applications of the current sensor in modern power electronics at higher energy efficiency and power densities through increased working frequencies.

For the purposes of the invention, alternating current I is considered to be a current with components affected by alternating current which is capable of generating such alternating magnetic fields about the current conductor, such that these may in turn induce eddy currents in the compensation element. These eddy currents thereupon generate a compensation magnetic field, which may compensate the original magnetic field distorted in a manner determined by frequency, as a result of the skin and proximity effect. These include, in addition to pure alternating currents (AC currents), also alternating currents affected by a direct current components and direct currents (DC currents) affected by harmonics as well as currents generally affected by harmonics or indeed direct currents which exhibits a series of rapid switching operations, which may for example arise in PWM modelling or on transfer of digital information. It is also possible, for example when using a double inverter structure, e.g. to feed an electric motor, to use an inverter with nominal frequency and a second inverter with a much higher frequency for smoothing harmonics. Phase currents to be measured in this case comprise a plurality of frequency components, which may be precisely measured relative to current sensors known from the prior art, which would appear to have marked inaccuracies.

In one advantageous embodiment, it is proposed for the compensation element to have a conductivity which may be greater than or equal to the conductivity of the current conductor. The compensation element may preferably consist of copper, aluminium or silver. Consequently, it is possible even with weak alternating fields for currents to be induced into the compensation element and a compensation magnetic field to be brought about. In this way, for example, the compensation element may consist of copper, while the current conductor is made of aluminium.

In one advantageous embodiment, it is proposed that the current conductor may comprise two conductor portions, wherein the sensor element may be arranged between the two conductor portions, and preferably configured as a gradient sensor. In this case, at least one and preferably two compensation elements may follow the course of the two conductor portions substantially along one sensor-active sub-portion. A simple structure of the current conductor is thus proposed, with two separate conductor portions flowed through by current. The conductor portions may be oriented parallel to one another and may be flowed through in the same or opposite direction by the current I or in each case by a part of the current I. The compensation elements may substantially follow the course of the conductor portions and be arranged spatially close to the conductor portions and to the sensor element, in order to influence the alternating magnetic field in terms of DC behaviour, wherein inexpensive compensation of the frequency-determined field distortions is enabled which is simple to produce in terms of manufacturing technology.

In an advantageous embodiment, it is proposed that the alternating current I of the current conductor flowing through the conductor portions is subdivided relative to a cross-sectional plane through the conductor portions and flows in the same direction. To this end, splitting of the current conductor into two parallel conductor portions may in particular be provided, wherein the total current is conducted in two partial currents through the two, generally parallel guided, conductor portions. The sensor element is arranged between the two conductor portions and the compensation elements correct the alternating magnetic fields in each case oriented in the same direction by the two conductor portions in terms of DC behaviour. To this end, the compensation elements may be formed as conductive solid bodies, in particular as metallic blocks, which, when viewed from the sensor element, are arranged between or at an angle to the conductor portions and the sensor element in a comparable or smaller radius than the conductor portions.

Alternatively, the conductor portions may also be guided such that the total current I is carried equidirectionally with regard to the sensor element through one conductor portion and through the second conductor portion, in order to achieve a magnetic field increase and thus an increase in sensitivity at low currents.

Building on the above-stated embodiment, the conductor portions of the current conductor may moreover advantageously be height-offset with regard to a measurement plane of the magnetic field-sensitive gradient sensor. In particular, one conductor portion may be guided below and one conductor portion above the measurement plane, wherein, relative to the sensor element, at least two compensation elements and the sensor element may be arranged in one plane, which does not have to be the measurement plane and which extends at an angle, in particular a right angle, to a plane running through the conductor portions and the sensor element. Furthermore, a radial distance between the compensation elements and the sensor element may preferably be less than or equal to a radial distance between the conductor portions and the sensor element. The exact geometric spacing and design of the compensation elements may be specified, for example on the basis of electromagnetic simulation methods and empirical values, after the nominal current to be measured and the desired frequency range have been preset.

As an alternative to the above-stated embodiment, the alternating current I flowing through the conductor portions of the current conductor may flow through the conductor portions in the opposite direction relative to a cross-sectional plane. In this case, a U-shaped course of the current conductor may in particular be provided, wherein the total current is carried in one conductor portion and fed back in the parallel second conductor portion. The sensor element is arranged height-offset between the two conductor portions, such that the magnetic fields has a tangential component in the direction of the conductor portions, and the compensation elements correct the alternating magnetic fields oriented in opposing direction in each case by the two conductor portions in terms of DC behaviour. To this end, the compensation elements may be formed as conductive solid bodies, in particular metallic blocks, which, when viewed from the sensor element, flank the conductor portions. Alternatively, the conductor portions may also be guided such that in each case one part of the total current I is carried through one conductor portion and one part of the total current I is carried through a second part of the conductor portion but in opposite directions relative to the position of the sensor element in order to allow a magnetic field reduction and thus a measurement range expansion in the case of high currents.

Building on the above-stated embodiment, the conductor portions of the current conductor and at least two compensation elements lie in a height-offset plane arranged parallel to the measurement plane of the sensor element, wherein the radial distance between the compensation elements is greater than the radial distance between the conductor portions and the sensor element. In particular, the compensation elements in a sensor-active sub-portion may symmetrically surround the conductor portions. In this regard, the conductor portions are arranged along a measurement plane of the sensor element symmetrical on both sides and the compensation elements are arranged radially further to the outside. As has already been explained, a current concentration and field overshoot arises in the region of the sensor element as the frequency increases. To counter this, the outlying compensation elements generate a compensation field due to the increase in inductivity, which compensation field counteracts the field overshoot between the conductor portions and thus enables a comparable field distribution to the case of DC. In this way, frequency-dependent signal value distortions may be effectively compensated in a wide frequency range.

In one advantageous further development of the above-stated embodiment, the current conductor may be substantially U-shaped with two parallel legs and a transverse leg, wherein the two parallel legs of the current conductor form the conductor portions, and wherein a further compensation element may preferably be arranged spatially adjacent the transverse leg. Thus metal blocks for example may be arranged as compensation elements around the U-shaped legs. It is important that the metal does not come into contact with the actual conductor, or cannot be flowed through by the current I. The same effect may also be used in the case of the transverse leg of the U-shaped current conductor, meaning that there is no risk of the supporting field of the sensor element being too greatly influenced by an AC current.

In one advantageous embodiment, the cross-sectional area of the compensation elements is 100% or less, preferably 80% or less, in particular 50% or less than the cross-sectional area of the conductor portions in the direction of the alternating current I. In this regard, the cross-section of the compensation element(s) may be less than or equal to the cross-section of the conductor portion or conductor portions, such that the compensation elements are not greater relatively than is the structure of the current conductor and are integrated in an element without significant enlargement of the element dimensions. Since the compensation field to be generated is relatively small compared with the measuring field to be generated by the conductor portion, the size of the compensation element may accordingly be the same size as or smaller than the conductor portion.

In one advantageous embodiment, the compensation element and the current conductor are arranged in galvanically isolated manner. This allows the greatest possible design latitude with regard to choice of materials, geometric shape and distance from the current conductor and the sensor element. To generate an effective compensation field, in particular an optimised length of the compensation element is needed in the direction of the course of the current through the current conductor, which is easy to achieve with an electrically isolated configuration. To this end, the compensation element and the current conductor are advantageously joined together mechanically non-conductively and in positionally fixed manner by a supporting structure such as a printed circuit board, plastics holder or the like or integrated in a common housing, e.g. encapsulated by injection moulding or casting using casting resin or plastics.

Alternatively, the compensation element may be formed as a spur of the current conductor, which follows the course of the current conductor in parallel. To this end, in the case preferably of two conductor portions the spurs assigned to the conductor portions are alternatingly oriented relative to the direction of the alternating current I. Although such a configuration forms a structural constraint for defining the design and spatial arrangement of the compensation elements, from a manufacturing point of view it is simple to produce in one piece with the current conductor with a connecting bridge as mechanical connection to the compensation element. It has been found that an alternating orientation of the spurs, i.e. of the position of the connecting bridges with regard to the direction of the current through the conductor portions offers an enhanced compensation action. In the case of height-offset conductor portions flowed through in the same direction, the compensation elements may in each case be oriented antiparallel to one another starting from one conductor portion. In the case of a U-shaped current conductor, the two compensation elements may be oriented in the same leg direction as the two parallel legs, since the two legs are flowed through antiparallel by the current I. It is important for the compensation elements, configured as a rule as metal blocks, to be connected non-conductively or only in the context of a spur to the current conductor and not to participate in current conduction. Depending on the geometry and nominal current of the current conductor, the compensation elements may be designed in cross-section, length and distance relative to the current conductor.

The mechanical connection and mechanical fastening of the compensation elements, which may for example take the form of metal blocks, should advantageously be made using nonconductive components. In one advantageous embodiment, the compensation element and the current conductor may be arranged on a PCB (Printed Circuit Board—electronic board). To this end, the sensor element is preferably arranged on the same or an opposing side of the PCB, and/or the compensation element and the current conductor are arranged in a housing. In this case, current conductors and compensation elements may be connected together for example via non-magnetic structural elements, for example screwed, clamped or otherwise fixed together, and/or fixed relative to one another in a housing, e.g. cast in plastics. For instance, the current conductor, for example in an embodiment as a U-shaped conductor, is typically fixed to the back face of a PCB, on the front face of which the sensor element is positioned. The compensation elements may likewise be fixed on the back face of the printed circuit board and/or the current conductor, the compensation elements and the PCB are included, and advantageously cast, in one and the same housing.

The embodiment of the compensation elements offers different control and influencing variables, which have a decisive influence on whether the frequency dependency is over-, under- or fully compensated. Thus, the parameters of the material used (specific electrical resistance, skin effect penetration depth and moreover height and width dimensions and also length) are optimisation variables for the compensation. The dimensions include a substantial proportion of effective area for incoupling of the alternating magnetic field, but also of impedance and thus current amplitude of the circulating current path of the eddy currents. The position of the compensation elements relative to the sensor element and the distance from the current conductor are likewise optimisable as an important control variable which, depending on field of application, can be varied with regard to manufacturing technology.

The invention relates equally to the use of an above-stated current sensor for magnetic field-based measurement of an electrical current through a current conductor. To this end, it is proposed that frequency-dependent distortions of the magnetic field are compensatable by a compensation magnetic field generated by induction in at least one conductive compensation element. This results in an inexpensive, straightforwardly achievable option for precisely measuring both DC and AC currents, even in the case of superimposed currents and transient switching operations.

Preferred configurations of the current sensor are described below in greater detail on the basis of embodiments illustrated in figures.

BRIEF DESCRIPTION OF THE DRAWINGS

Further advantages are revealed by the present drawings and the associated descriptions of the drawings. The drawings show exemplary embodiments of the invention. The drawings and description contain numerous features in combination. A person skilled in the art will expediently also consider the features individually and combine them into meaningful further combinations.

In the figures.

DETAILED DESCRIPTION OF THE INVENTION

Identical elements are denoted with the same reference signs in the figures. The figures merely show examples and should not be understood as being limiting.

Figure 1:
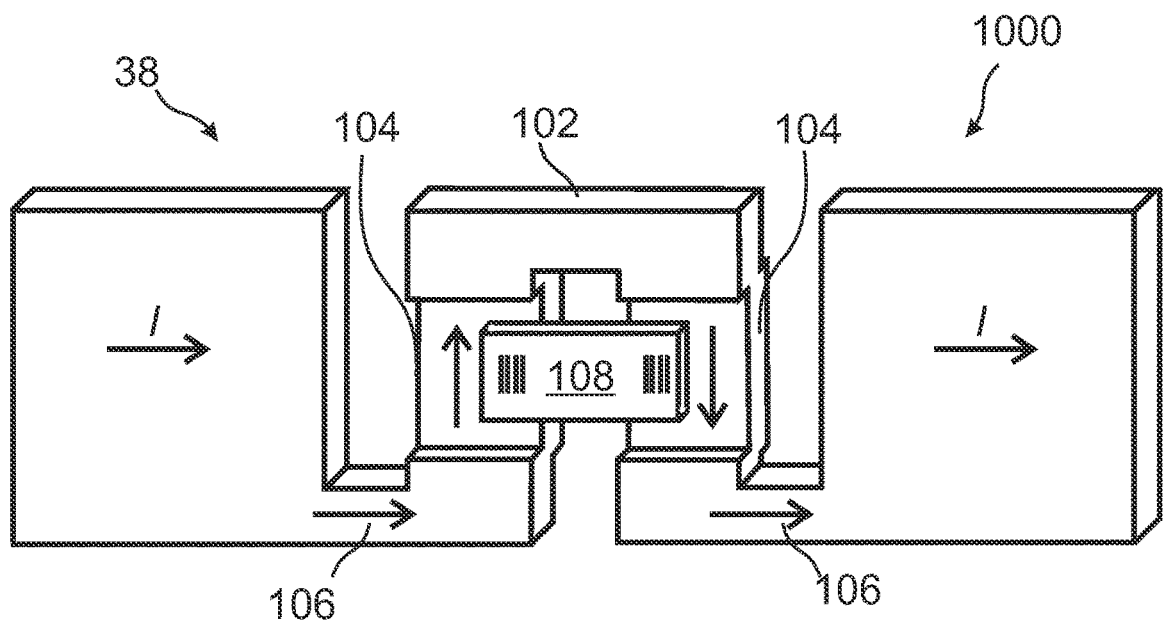
FIG. 1 is a perspective representation of a prior art current sensor with U-shaped current conductor.

FIG. 1 shows a first prior art current sensor 1000 known from WO 2014/001473 A1. The current sensor 1000 has a sensor element 108 and a U-shaped current conductor 38, in which the leg 104 active in terms of current measurement is set back in a z-direction relative to the transverse leg 102 parasitic in terms of current measurement and the connecting line 106, such that parasitic magnetic field components penetrate a magnetic field-neutral orientation plane of the sensor structure of the sensor element 108 substantially at right angles. The arrangement, offset in the z direction, of the legs 104 relative to the connecting lines 106 and the transverse leg 102 ensures that parasitic magnetic field components are suppressed or merely pass through a magnetic field-neutral orientation plane, while the magnetic field components which are active in terms of current measurement and are to be detected pass through the magnetic field-sensitive orientation plane of the sensor element 108. The measurement of higher frequency currents over 100 Hz, preferably over 500 Hz, in particular over 1 kHz, and especially over 10 kHz suffers from the fact that, due to the skin and proximity effect, the alternating magnetic field is concentrated between the two conductor portions 104, resulting in a distinctly nonlinear deviation of the signal values from the current magnitude, which can only be compensated with complex filter circuits.

Figure 2:
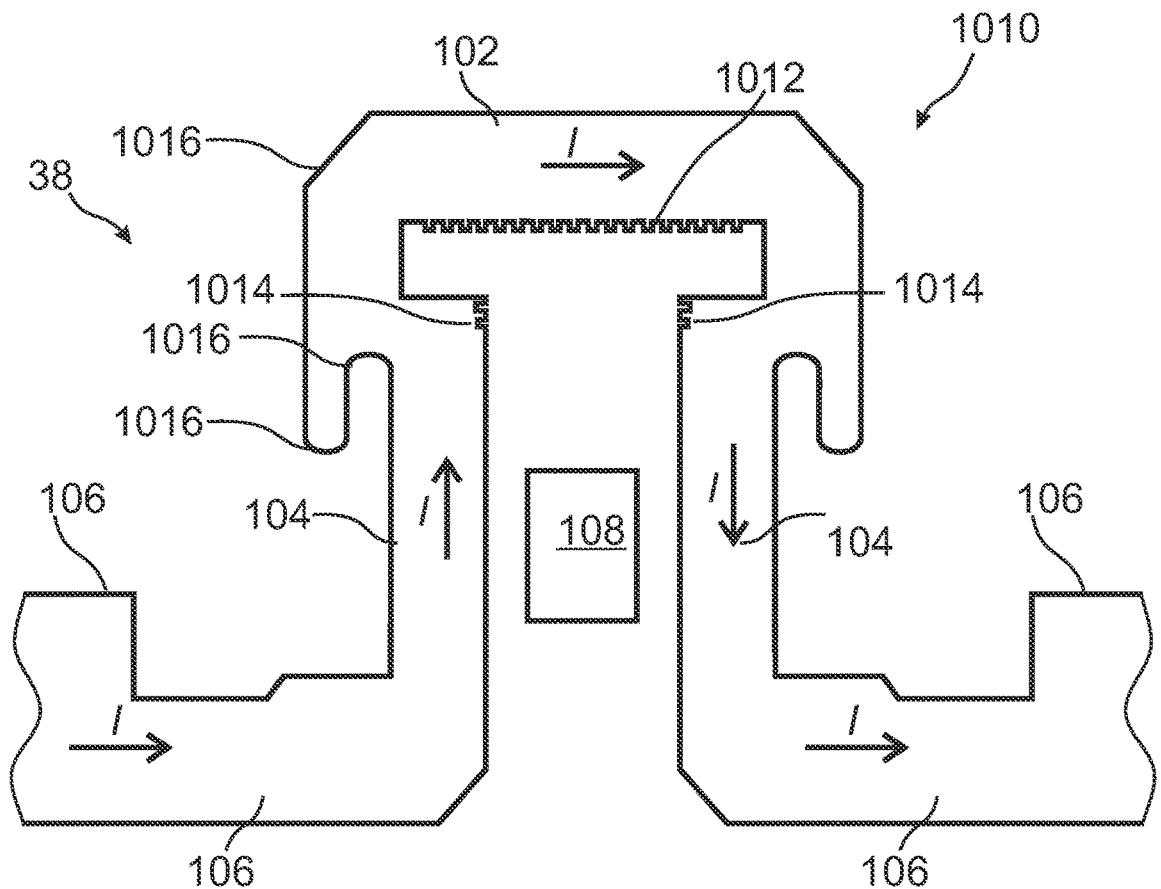
FIG. 2 is a plan view of a prior art U-shaped current conductor.

To that effect, FIG. 2 shows an improved layout of a U-shaped current conductor 38, which is optimised for AC measurement. To this end, the current conductor 38 has AC matching structures 1012 in the transverse leg 102 and matching structures 1014 in the conductor portions 104. In addition, corners and edges 1016 are rounded, serving primarily in thermal optimisation of the operating behaviour. In this case, the current sensor 1000 with U-shaped current conductor 38 may have a relatively complex geometry for selected applications and in a narrow, previously known frequency range allow compensation of skin and proximity effect.

Figure 3:
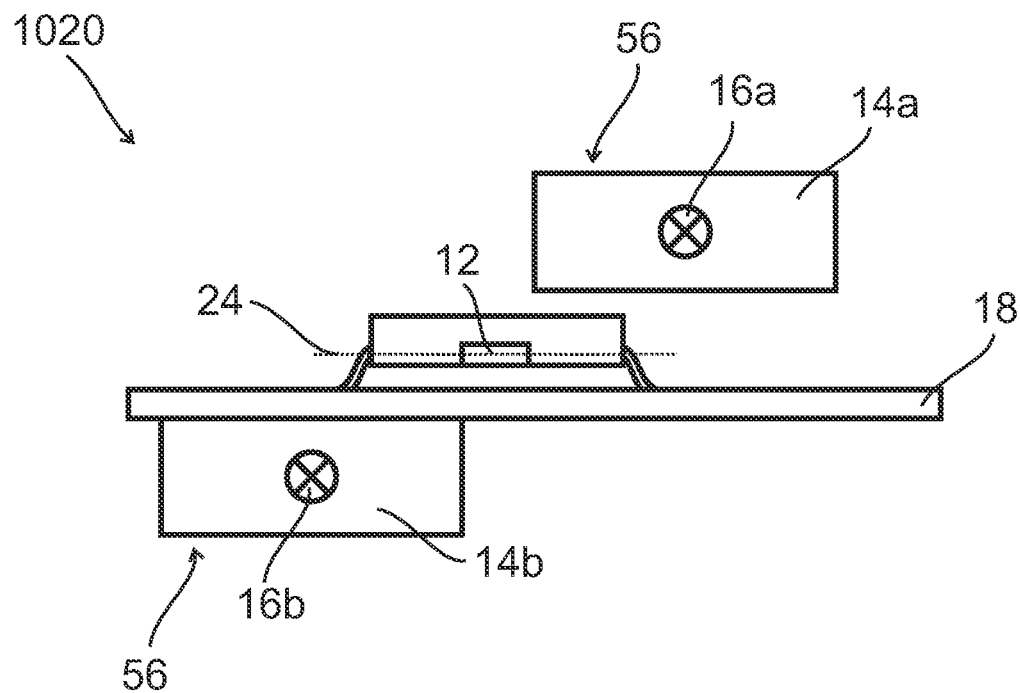
FIG. 3 is a perspective representation of a prior art current sensor with height-offset conductor portions.

FIG. 3 shows a second prior art current sensor 1020 known from WO 2019/072421 A1. A current conductor 56 is subdivided into two conductor portions 14a, 14b, wherein a corresponding current component 16a and current component 16b flow in the same current flow direction in the conductor portions 14a, 14b. A sensor element 12 on a PCB film 18 is placed between the two conductor portions 14a, 14b, wherein the sensor element 12 takes the form of a gradient sensor, which measures a magnetic field strength difference of one tangential component of the magnetic field in a measurement plane 24. The measurement plane 24 is in this case defined such that magnetic field-sensitive resistors of the sensor element 12 are located therein, which resistors are sensitive with regard to vector components of the magnetic field which lie parallel in the measurement plane 24 (tangential components). Furthermore, the two conductor portions 14a, 14b are height-offset antiparallel with regard to the measurement plane 24. When measuring high-frequency currents, the skin and proximity effects cause nonlinear distortions of the measuring magnetic field at the location of the sensor element 12, resulting in a marked deviation of the sensor signals with identical current intensity relative to the DC case, and therefore the current sensor 1020 can only be used for precise current measurement in narrowly limited frequency ranges.

Figure 4:
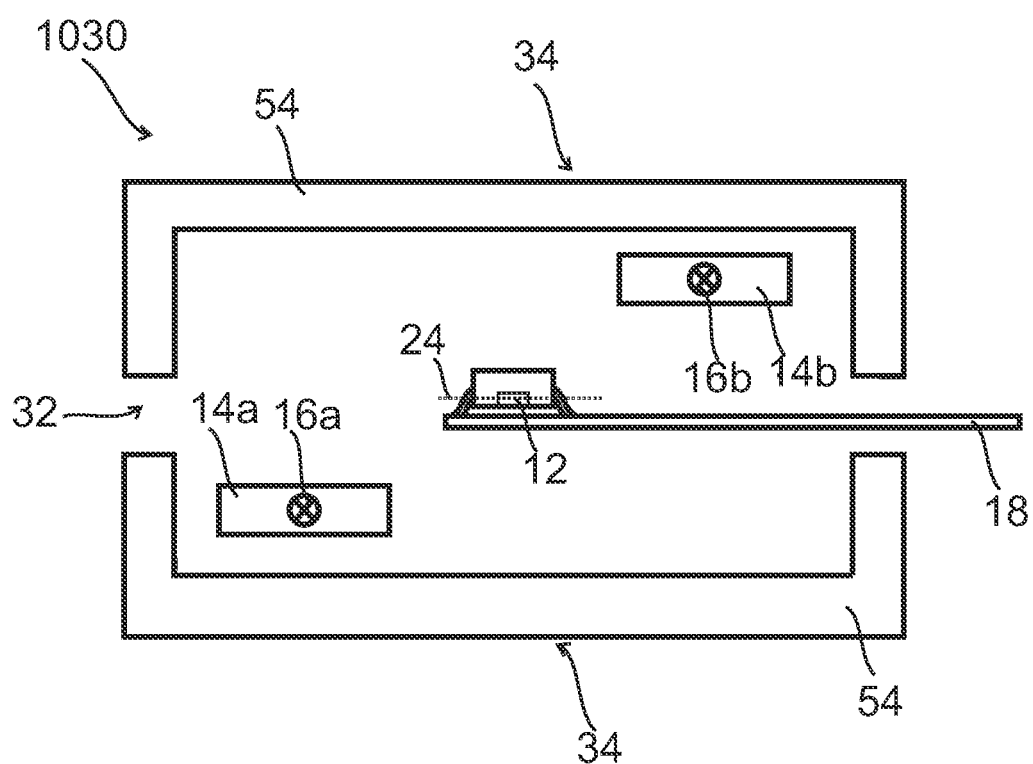
FIG. 4 is a perspective representation of a shielded prior art current sensor with height-offset conductor portions.

The configuration of the current sensor 1020 shown in FIG. 3 depicted in FIG. 4 as a further fourth, further developed current sensor 1030 known from WO 2019/072421 A1. This current sensor arrangement comprises two conductor portions 14a, 14b and a sensor element 11. Arranged between the two conductor portions 14a, 14b is the sensor element 11, in which the magnetic field-sensitive sensor element 12 detects the gradient field and which is arranged on the PCB film 18. The two conductor portions 14a, 14b are height-offset symmetrically and antiparallel relative to the measurement plane 24, in which the magnetic field strength difference is measured. Current component 16a and current component 16b flow in the same direction in the conductor portions 14a, 14b. Outside the current sensor arrangement, two rectangular shielding portions 54 are formed as magnetic shielding 34, these having two slots 32 and providing shielding against interfering influences in accordance with FIG. 9. In this regard, the current sensor 1030 is protected against external stray fields and EMC robustness is increased. However, the problems addressed in relation to the current sensor 1020 of FIG. 3 remain, i.e. a frequency-dependent sensor signal which makes broadband measurement of current of different frequency positions more difficult.

Figure 5A:
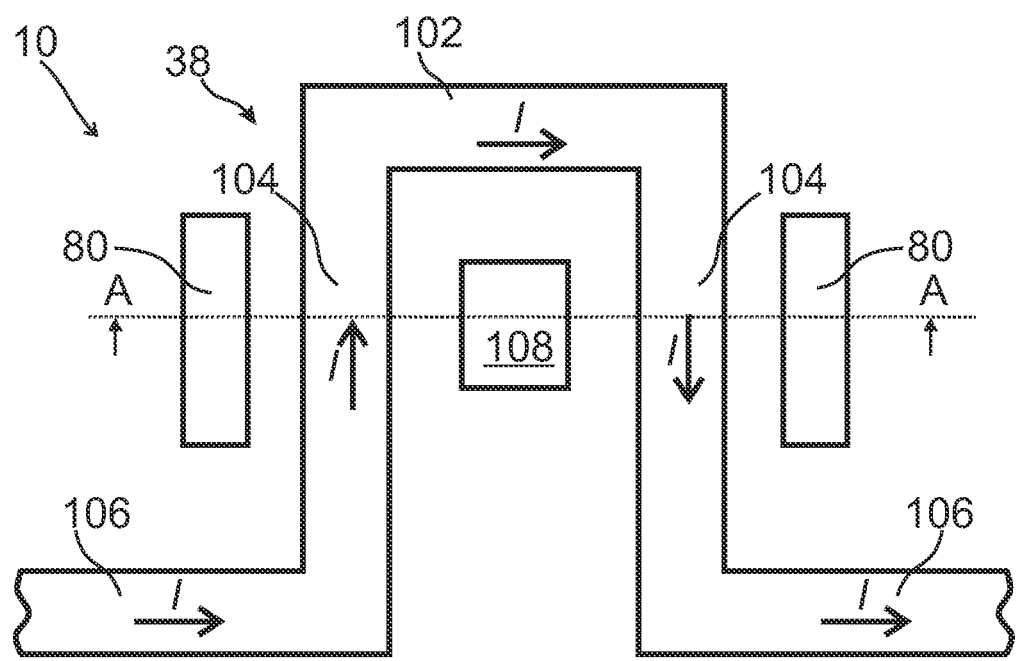
FIGS. 5a-d show plan views of a first, second and third exemplary embodiment of a current sensor according to the invention with U-shaped current conductor.
Figure 5B:
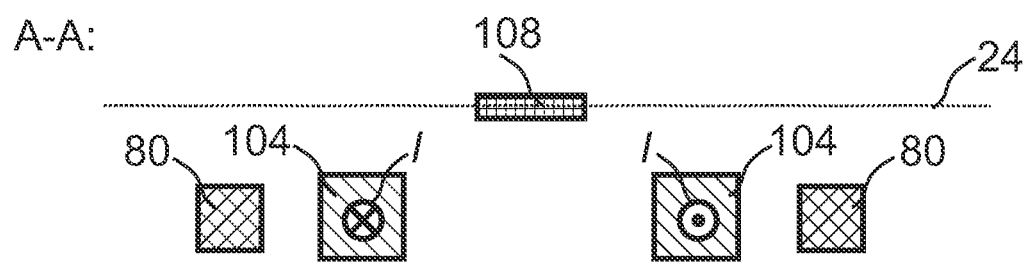

FIGS. 5a and 5b show a first embodiment 10 of a current sensor according to the invention in plan view and sectional representation. FIG. 5a shows a plan view of the current conductor 38 and FIG. 5b shows a sectional representation along section line A-A shown in FIG. 5a. The current conductor 38 is U-shaped and comprises two connecting lines 106 for incoupling and dissipating the current I to be measured. Arrows symbolise the current direction in the DC case. The current conductor 38 comprises a transverse leg 102 and two longitudinal legs as conductor portions 104, which bring about a measuring magnetic field, the gradient of which can be detected by sensor element 108 arranged symmetrically therebetween. To compensate the skin and proximity effect, two metallic blocks are arranged as compensation elements 80 in a section plane A-A radially spaced from the line portion 104. In these compensation elements 80, eddy currents are generated by induction, which eddy currents bring about a compensation field which, in the region of the sensor element 108 height-offset relative to the plane of the conductor portions 104 and compensation elements 80, in the measurement plane 24 thereof, counteracts a frequency-dependent nonlinear field distortion and thus brings about a similar measurement signal at identical current intensities as in the DC case. Signal behaviour can thus be rendered uniform over a wide frequency range at identical nominal currents and the impact of the skin and proximity effect compensated.

The actually interfering effects (skin and proximity) are used by the arrangement of additional metal of the compensation elements 80 in order to make the resultant alternating magnetic field or transient magnetic field independent of the frequency of the current. In this case, the current distribution and in particular the magnetic field should ideally correspond to those of the DC case (direct current measurement).

Figure 5C:
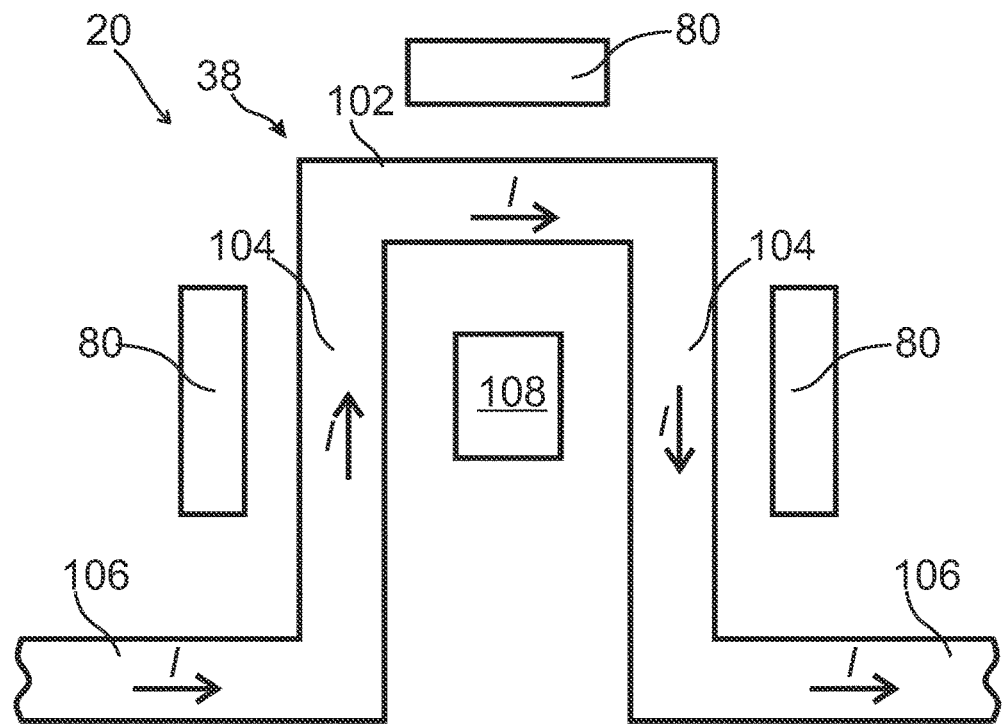

Compared with the first embodiment 10, the second embodiment 20 shown in FIG. 5c likewise has a compensation element 80 arranged along the transverse leg 102. This serves to compensate the interfering magnetic field generated by the transverse leg 102 to the same extent as the measuring magnetic field of the conductor portions 104, in order to compensate a secondary frequency-dependent influence of the parasitic interference field of the transverse leg 102. Nonetheless, further compensation elements may also be provided in the region of the connecting lines 106.

Figure 5D:
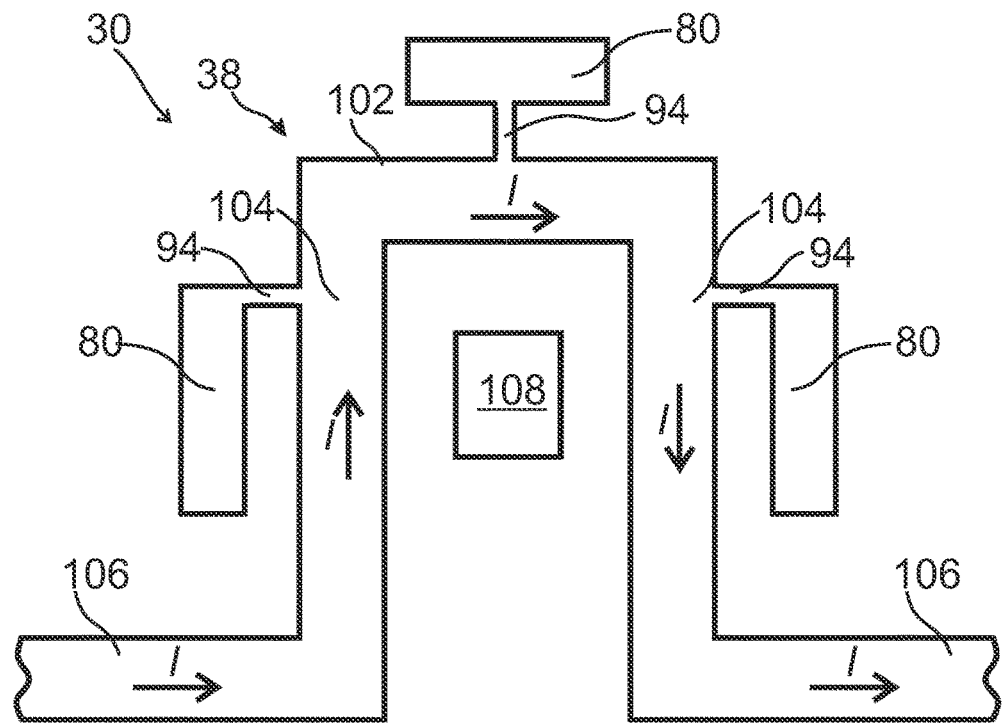

Moreover, FIG. 5d shows a plan view of a third embodiment 30, which differs from the second embodiment 20 in that the compensation elements 80 are connected in one piece with the current conductor 38 via connecting bridges 94. The connecting bridges 94 are formed for example together with the compensation elements 80 and the current conductor 38 as a stamped part. Alternatively, the connecting bridges 94 may also be subsequently welded or soldered on, for example, and constitute a metallic connection without current flow between current conductor 38 and compensation element 94. Alternatively, the connecting bridge 94 may consist of a nonconductive material such as plastics. The connecting elements 94 may advantageously be arranged in a direction of current travel at alternating ends of the compensation elements 80, as is the case in FIG. 5d with the compensation elements 80 assigned to conductor portions 104. Also conceivable is an arrangement of the connecting bridge 94 in the centre of the compensation element 80, as shown on the transverse leg 102.

Figure 6A:
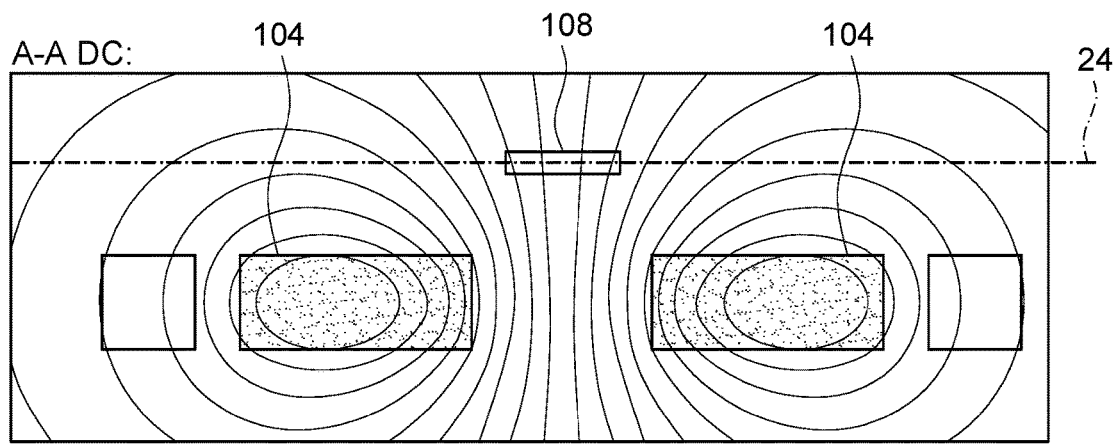
FIGS. 6a-c show the current density and magnetic field distribution of the current sensor shown in FIG. 5, in various embodiments.
Figure 6B:
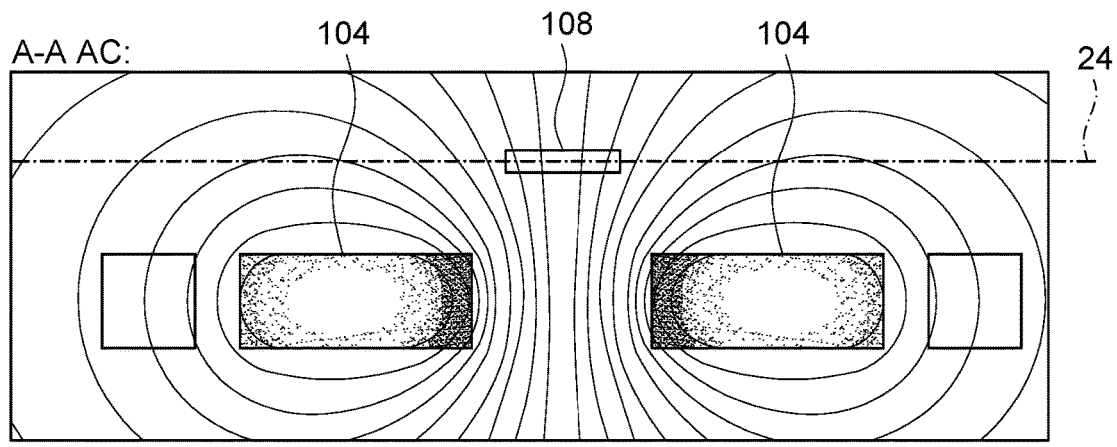
Figure 6C:
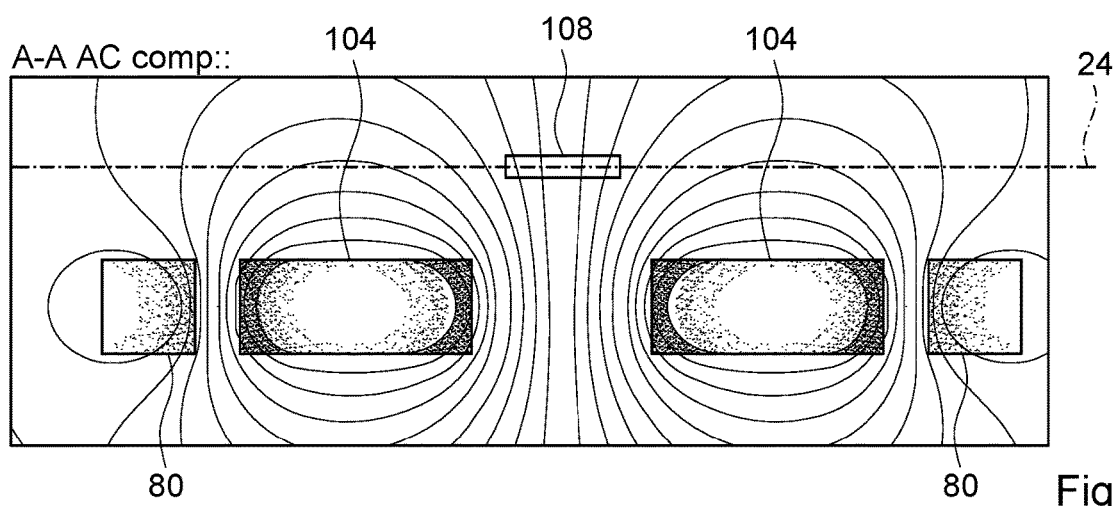

On the basis of an electromagnetic simulation, FIGS. 6a to 6c show the current distribution and a representation of flux lines of the alternating magnetic field in cross-section A-A of FIG. 5b through a U-shaped current conductor with parallel conductor portions 104, which is arranged height-offset relative to the measurement plane 24 in a parallel plane therebelow in relation to the gradient sensor element 108. FIG. 6a here shows direct current operation (DC case). FIG. 6b shows a current affected by alternating current (AC case) without compensation, a potential position of compensation elements 80 being indicated schematically. The change, relative to the direct current case, in current density distribution and magnetic field of the two conductor portions 104 is clear, the two moving closer together. FIG. 6c shows measurement of an alternating current with optimised position and shape of compensation elements 80 (AC case with compensation). In this case, the compensation elements 80 are made from copper and the conductor portions 104 from aluminium. In the absence of compensation, FIG. 6b clearly shows concentration of the current in the middle, which leads to an increase in the gradient field compared with a DC current. In the case with compensation in FIG. 6c, it is clear that part of the current is drawn outwards to the copper blocks of the compensation elements 80. This leads to virtually the same magnetic field as in the DC case according to FIG. 6a being established at the sensor element 108, and thus to the nonlinear distortion effects of skin and proximity effect being compensated.

Figure 7:
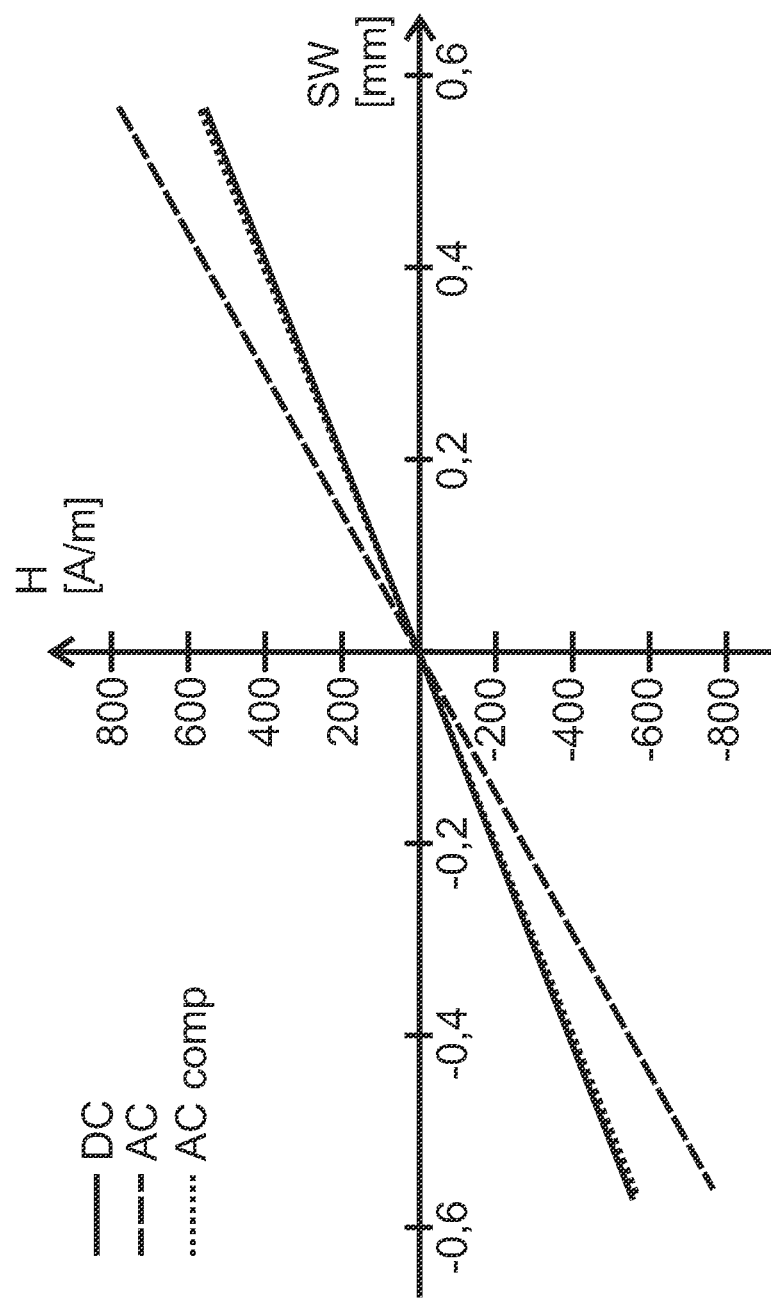
FIG. 7 shows a simulated gradient field with different spacings of the current conductors in the different embodiments of FIG. 6.

FIG. 7 shows an investigation of a measured magnetic field dependent on a basic width of the sensor element 108 in three cases DC, AC and AC with compensation (AC comp) and an identical nominal current intensity I: the basic width SW of the sensor element 108, which correlates with the distance for determining the gradient field, is plotted on the x axis and the magnitude of the measured magnetic field strength gradients is plotted on the y axis. In the case of a direct current measurement (DC case) and in the case of optimised compensation (AC comp case), the magnitude of the basic width of the sensor element 108 has virtually no effect on the measured value of the gradient field. This suggests that the compensation field provides an identical field configuration in the compensated AC case as in the DC case. In the absence of compensation elements 80 (AC case), the gradient field deviates markedly from the DC case as the basic sensor width SW increases.

Figure 8:
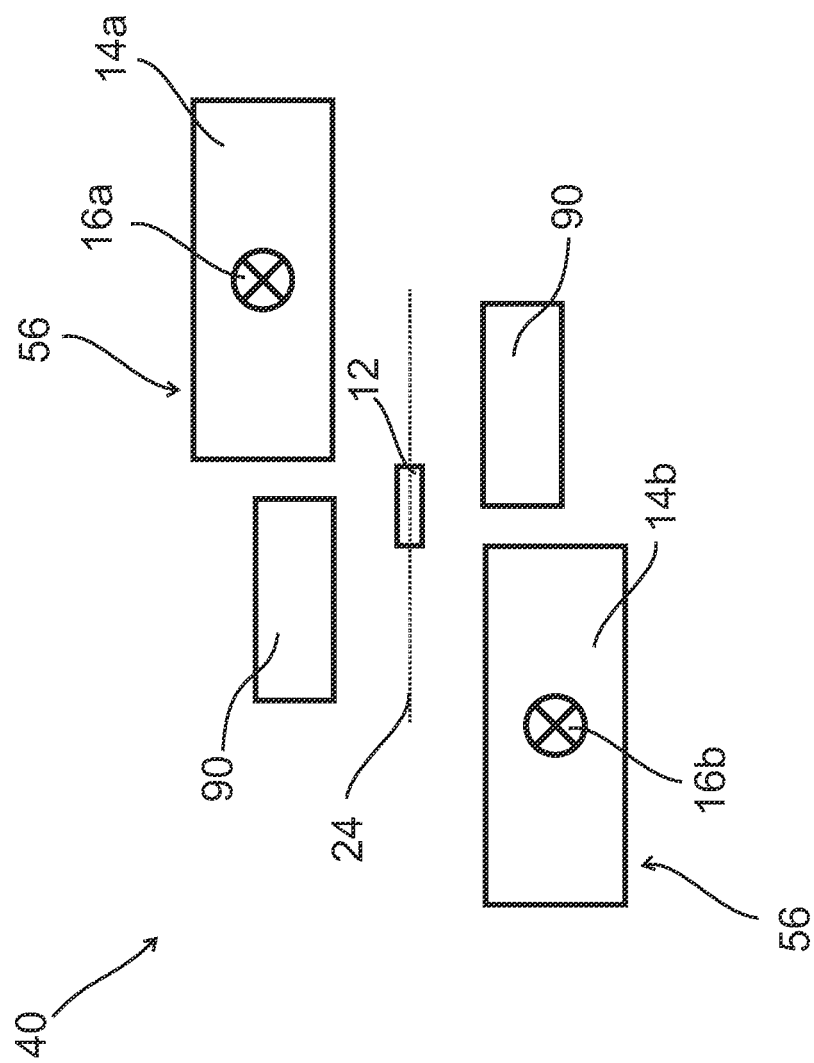
FIG. 8 is a plan view of a fourth exemplary embodiment of a current sensor according to the invention with height-offset conductor portions.

FIG. 8 is a schematic representation of a fourth embodiment 40 of a current sensor with height-offset conductor portions 14a, 14b. In principle, the structure and function of the current sensor 40 correspond to that of the prior art current sensor 1020 shown in FIG. 3. In addition, two compensation elements 90 are provided, which are arranged height-offset relative to the measurement plane 24 and complementarily to the conductor portions 14a, 14b. The cross-sectional area of the compensation elements 90 amounts to around 35% of the cross-sectional area of the conductor portions 14a, 14b and the radial distance of the centres of gravity of the compensation elements 80 from the sensor element 12 is markedly smaller than the radial distance of the centres of gravity of the conductor elements 14a, 14b.

Figure 9:
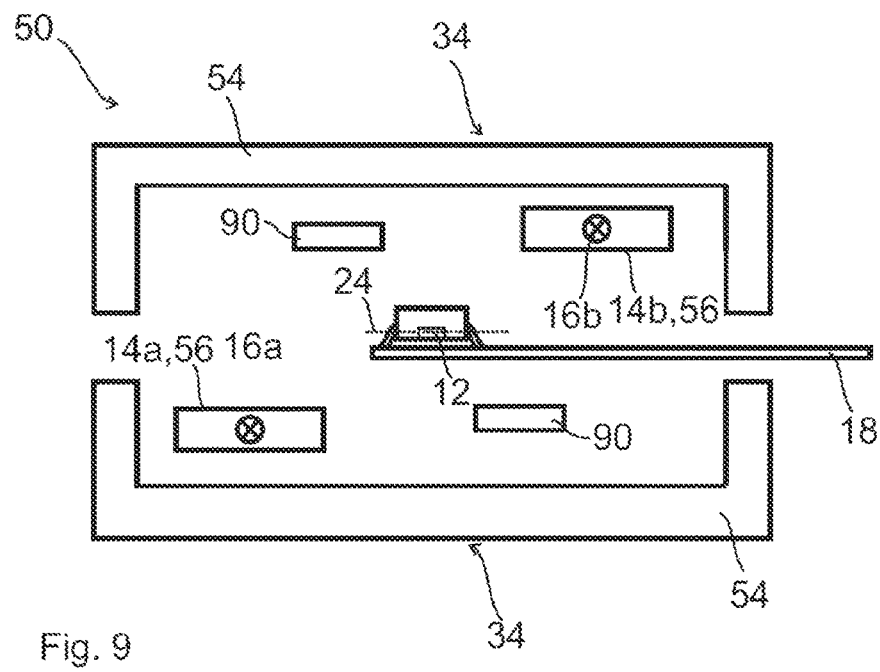
FIG. 9 is a plan view of a fifth exemplary embodiment of a current sensor according to the invention with height-offset conductor portions and magnetic shielding.

Building on the fourth embodiment 40 of FIG. 8, FIG. 9 shows a fifth embodiment 50, which likewise corresponds in principle to the prior art current sensor 1030 shown in FIG. 4. The arrangement of the compensation elements 90 substantially follows the configuration shown in FIG. 8. Irrespective of the magnetic shielding 54, the compensation elements 90 bring about a magnetic total alternating field corresponding to a DC current measurement.

Figure 10:
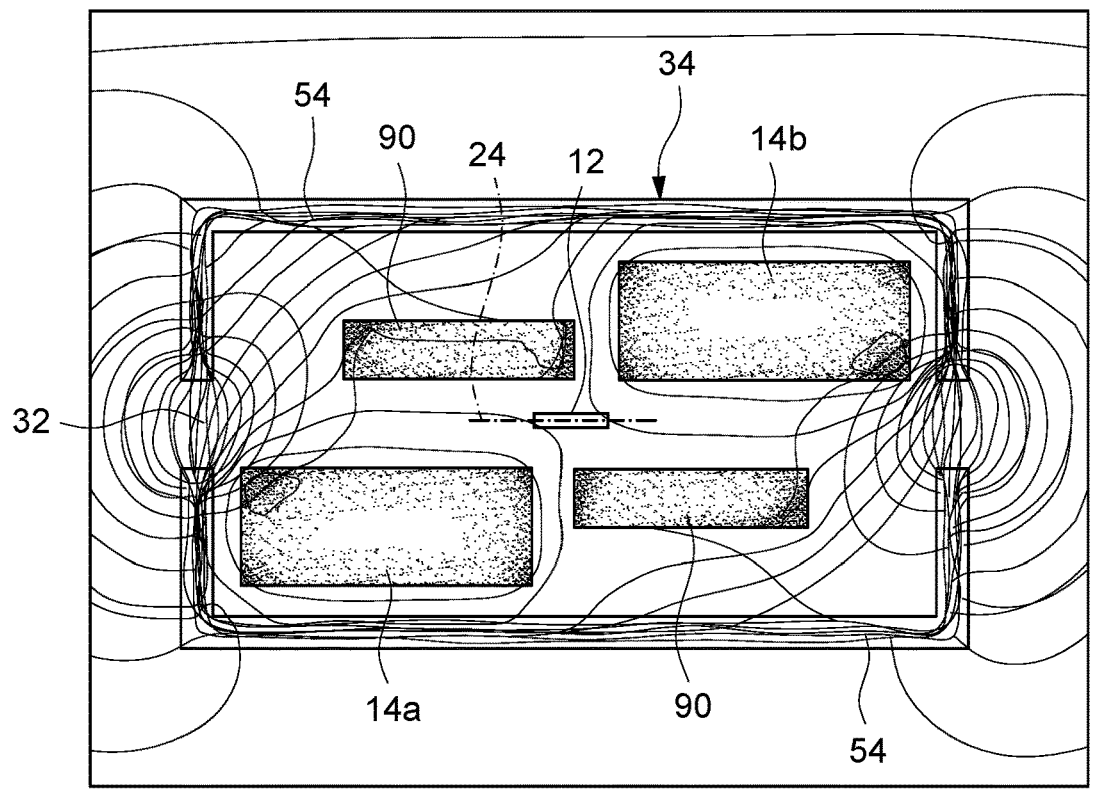
FIG. 10 shows the current density and magnetic field distribution of the exemplary embodiment shown in FIG. 9.

FIG. 10 is a depiction of a current density distribution and of the magnetic field in AC operation of the current sensor 50 shown in FIG. 9. The eddy current and compensation field are clearly apparent in the compensation elements 90, which, independently of the magnetic shielding 54 on the sensor element 12, bring about a frequency-independent magnetic field distribution.

Figure 11:
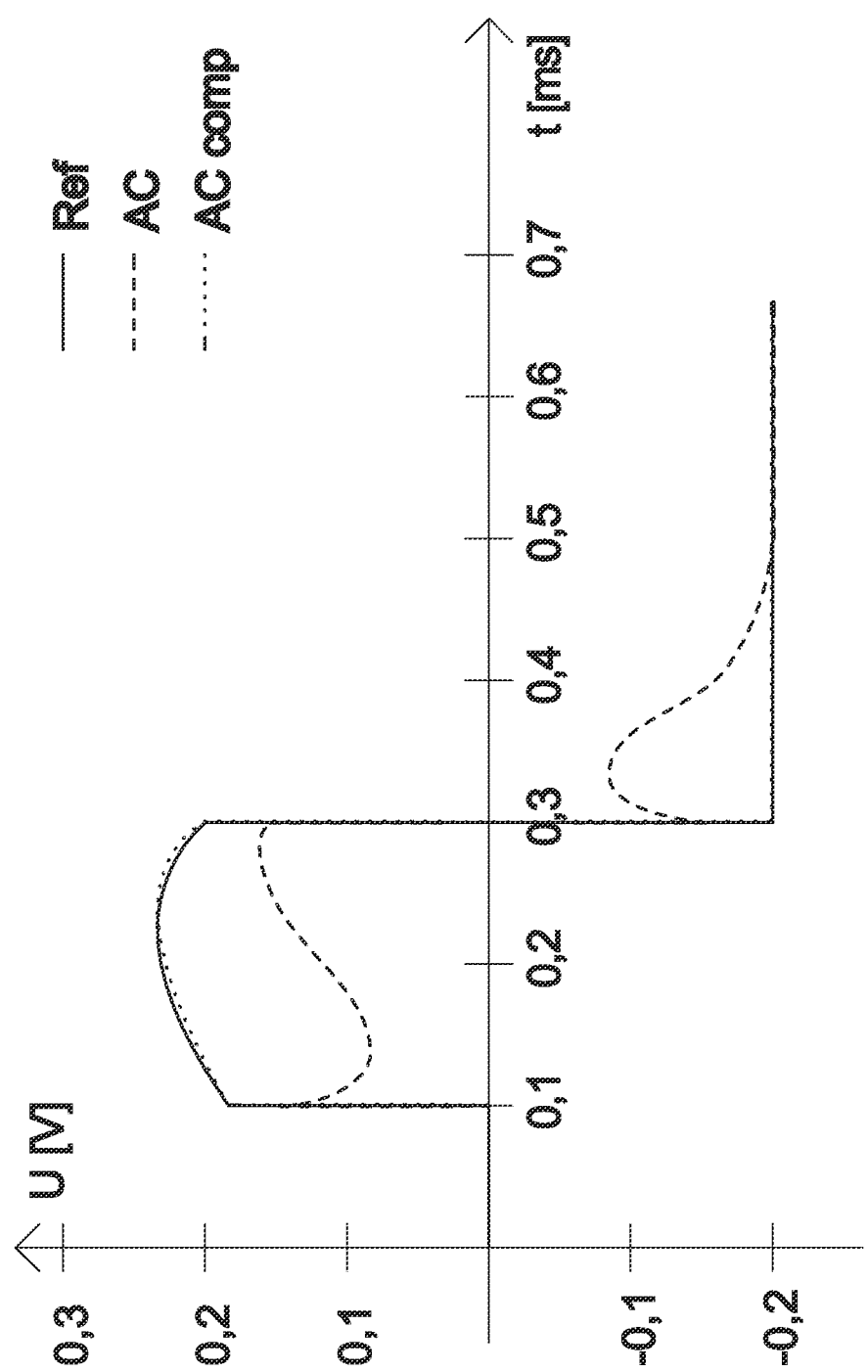
FIG. 11 shows the signal curve of a switching operation of the current sensor shown in FIG. 9.

The diagram of FIG. 11 shows an output signal curve of the current sensor 50 of FIG. 9. In this case, a DC current is switched in a short time sequence, and the output voltage signal curve of the sensor element 12 is plotted over time. In the compensated variant (AC comp.), the output signal curve of the sensor element 12 exactly follows the reference curve Ref, wherein in an uncompensated variant, as represented in FIG. 4 by current sensor 1030, a marked undershoot occurs due to the transient step change with a plurality of frequencies and corresponding distortions due to the mutual inductance of the current conductor 56.

Figure 12:
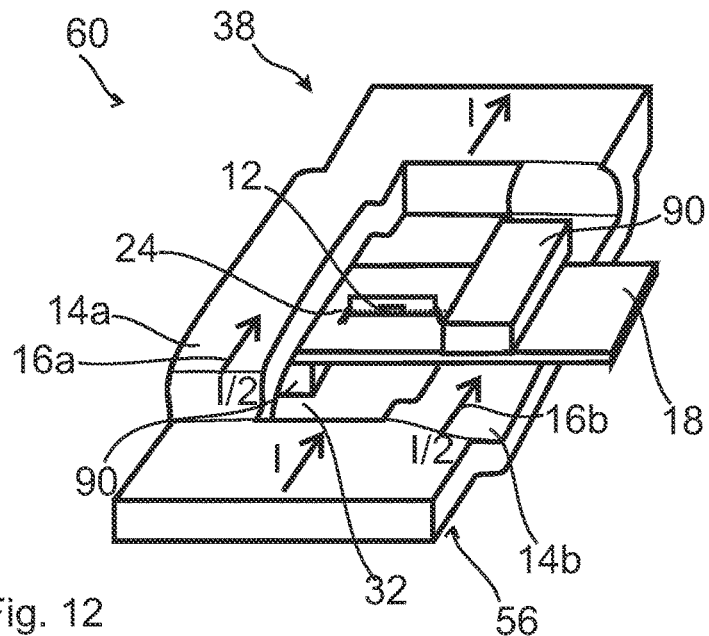
FIG. 12 is a perspective representation of a sixth exemplary embodiment of a current sensor according to the invention.

FIG. 12 shows a sixth embodiment 60 of a current sensor arrangement. The current conductor 56 takes the form of a one-piece stamped bent part, which is subdivided into two parts and has the slot 32, in which the sensor element 11 is arranged on the PCB film 18. In this case, the slotted portions are configured as conductor portions 14a, 14b. A primary current I flows in the current conductor 56, which primary current is subdivided into two current components 16a, 16b by the conductor portions 14a, 14b and is carried in the same direction with regard to the magnetic field-sensitive sensor element 12. As a result of a flexible PCB film 18, the magnetic field-sensitive sensor element 12 may be introduced in spatially variable manner into the slot 32 in the current conductor 56. Two compensation elements 90 are in each case arranged in complementary manner to the conductor portions 14a, 14b and in a substantially parallel arrangement such that this arranges a suitable compensation field for a wide frequency range. The compensation elements 90 may for example be fastened by means of plastics mounts temporarily to the current conductor 38 and firmly cast in a housing by means of a flowable plastics or casting resin.

Figure 13:
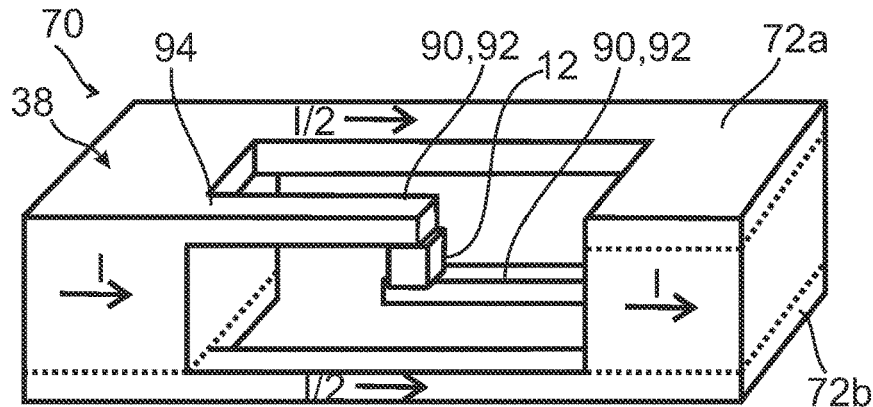
FIG. 13 is a perspective representation of a seventh exemplary embodiment of a current sensor according to the invention.

FIG. 13 shows a seventh embodiment of a current sensor arrangement 70. In contrast to FIG. 12a, the current conductor takes the form of two stamped bent parts connected together. The stamped bent part 72a and the stamped bent part 72b are soldered together, riveted together or welded, such that the two stamped bent parts may be connected together, and optionally spaced by spacers, which define a spatial distance from the measurement plane 24. In this way, the stamped bent parts 72a, 72b can be formed as two conductor portions 14a, 14b. Since the two stamped bent parts 72a, 72b are configured antiparallel to one another, the magnetic field-sensitive sensor element 12 may optionally (not shown) be arranged tilted relative to the two stamped bent parts, preferably by 45° relative to the two stamped bent parts, in order to adapt the measurement plane to the magnetic field profile. The primary current I may thereby be measured. The compensation elements 90 may be formed in one piece with the stamped bent part 72a, 72b as elongate fingers or spurs 92 with integrated connecting bridge 94. The compensation elements 94 are here arranged alternately, in this case antiparallel relative to one another with regard to a current direction through the current conductor 38, whereby optimised compensation of frequency-determined distortions may be achieved.

Figure 14:
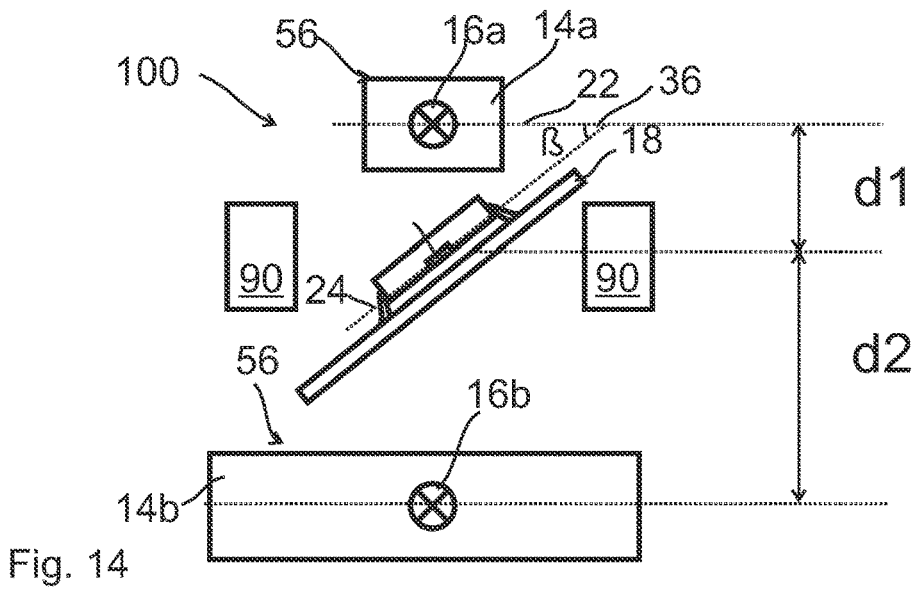
FIG. 14 is a schematic representation of an eighth exemplary embodiment of a current sensor according to the invention.

FIG. 14 shows a eighth embodiment of a current sensor arrangement 100. The current conductor 56 is subdivided into two conductor portions 14a, 14b of differently sized cross-sections and which lie in a common conductor plane 22. Corresponding to the cross-sections, differing current components 16a and 16b are carried in the two conductor portions 14a, 14b, these components being of identical direction but non-identical size. The sensor element 11 arranged on the PCB film 18 is arranged at an angle β 36 to the conductor plane 22, i.e. the magnetic field-sensitive sensor element 12 is tilted relative to the conductor plane 22. The angle β 36 is preferably selected in a range from 30° to 60°, preferably 45°. If the current component 16a is smaller than the current component 16b, the two conductor portions 14a, 14b are arranged asymmetrically relative to the measurement plane 24. In other words, the distance between the measurement plane 24 and the conductor portion 14a may be less than the distance between the measurement plane 24 and the conductor portion 14b, whereby the magnetic field strength difference may be measured precisely by the magnetic field-sensitive sensor element 12.

In this case, a current measurement is shown which relates to the eighth embodiment of a current sensor arrangement 100. The two conductor portions 14a, 14b are arranged in a common conductor plane, wherein the conductor portions 14a, 14b have the current component 16a and current component 16b, which have a non-identical current magnitude and are carried in the same current flow direction. The measurement plane 24 is tilted relative to the two conductor portions 14a, 14b by an angle β, wherein as a result of the current asymmetry the two conductor portions 14a, 14b are arranged asymmetrically relative to the measurement plane 24. In this embodiment, the distance d1 between the conductor portion 14a and the conductor plane 24 is less than the distance d2 between the conductor portion 14b and the conductor plane 22. The two magnetic fields 60a, 60b brought about intersect at the measurement plane 24. The magnetic field-sensitive gradient sensor may thus measure the difference between the two magnetic fields. Optimum asymmetric orientation and the various distances relative to the conductor portions may be identified in advance during the design process by means of computer-aided field simulation or empirically by mechanical calibration for a desired current measurement range. The frequency-dependent measuring behaviour may be compensated by means of compensation elements 90, which lie in a plane at right angles to the plane defined by the conductor portions 14a, 14b.

LIST OF REFERENCE NUMERALS

10 First exemplary embodiment of a current sensor
12 Sensor element
14a Conductor portion a
14b Conductor portion b
16a Current component a
16b Current component b
18 PCB film
20 Second exemplary embodiment of a current sensor
22 Conductor plane
24 Measurement plane
30 Third exemplary embodiment of a current sensor
32 Slot
34 Magnetic shielding
36 Angle β
38 Current conductor
40 Fourth exemplary embodiment of a current sensor
50 Fifth exemplary embodiment of a current sensor
54 Shielding portion
56 Current conductor
60 Sixth exemplary embodiment of a current sensor
70 Seventh exemplary embodiment of a current sensor
72a U-shaped stamped bent part a
72b U-shaped stamped bent part b
80 Compensation element
90 Compensation element
92 Spur
94 Connecting bridge of the spur
100 Eighth exemplary embodiment of a current sensor
102 Transverse leg
104 Conductor portion, leg
106 Connecting line
108 Sensor element
1000 First current sensor (prior art)
1010 Current conductor for current sensor (prior art)
1012 AC matching structures in transverse leg
1014 AC matching structures in longitudinal leg
1016 Rounding and bevelling of the current conductor
1016 Rounding and bending of conductor guide
1020 Second current sensor (prior art)
1030 Third current sensor (prior art)
d1 Distance between conductor portion a and measurement plane
d2 Distance between conductor portion b and measurement plane
I Alternating current to be measured

The invention claimed is:

1. A current sensor for magnetic field-based current determination of an alternating current through a current conductor on the basis of a magnetic field-sensitive sensor element, wherein the sensor element arranged spatially adjacent the current conductor for detecting a magnetic field brought about in the current conductor by the alternating current;
wherein at least one metal block in the form of a conductive compensation element with a cross-sectional area of at least 50% to 100% of a cross-sectional area of the current conductor arranged in electrically isolated manner from the flow of alternating current through the current conductor and in such a way spatially adjacent the sensor element and the current conductor to compensate frequency-dependent distortions of the magnetic field by means of a compensation magnetic field arising by eddy current induction, such that interfering influences of frequency-dependent current density effects of the current conductor on the sensor element are compensated by the compensation magnetic field of the compensation element.

2. The current sensor according to claim 1, wherein the compensation element has a conductivity which may be greater than or equal to a conductivity of the current conductor, wherein the compensation element preferably consists of copper, aluminium or silver.

3. The current sensor according to claim 1, wherein the current conductor comprises two conductor portions, wherein the sensor element is arranged between the two conductor portions, and preferably configured as a gradient sensor and wherein at least one and preferably two compensation elements follow a course of the two conductor portions substantially along one sensor-active sub-portion.

4. The current sensor according to claim 3, wherein the alternating current of the current conductor flowing through the conductor portions is subdivided relative to a cross-sectional plane through the conductor portions and flows in the same direction.

5. The current sensor according to claim 4, wherein the conductor portions of the current conductor are height-offset with regard to a measurement plane of the magnetic field-sensitive gradient sensor, in particular in that one conductor portion is guided below and one conductor portion above the measurement plane, wherein, relative to the sensor element, the compensation elements and the sensor element are arranged in one plane, which extends at an angle, in particular a right angle, to a plane running through the conductor portions and the sensor element, and wherein furthermore a radial distance between the compensation elements and the sensor element may preferably be less than or equal to a radial distance between the conductor portions and the sensor element.

6. The current sensor according to claim 3, wherein the alternating current flowing through the conductor portions of the current conductor flows through the conductor portions in an opposite direction relative to a cross-sectional plane.

7. The current sensor according to claim 6, wherein the conductor portions of the current conductor and the compensation elements lie in a measurement plane of the sensor element, wherein a radial distance between the compensation elements is greater than a radial distance between the conductor portions and the sensor element, in particular the compensation elements in a sensor-active sub-portion symmetrically surround the conductor portions.

8. The current sensor according to claim 6, wherein the current conductor is substantially U-shaped with two parallel legs and a transverse leg, wherein the two parallel legs of the current conductor form the conductor portions, and wherein a further compensation element is preferably arranged spatially adjacent the transverse leg.

9. The current sensor according to claim 1, wherein the compensation element and the current conductor are arranged on a PCB, wherein the sensor element is preferably arranged on a same or an opposing side of the PCB, and/or the compensation element and the current conductor are arranged in a housing.

10. The use of a current sensor for magnetic field-based measurement of an electrical current through a current conductor according to claim 6, wherein frequency-dependent distortions of the magnetic field are compensated by a compensation magnetic field generated by eddy current induction in the at least one conductive compensation element.

* * * * *